United States Patent
Lu

(10) Patent No.: US 7,239,027 B2
(45) Date of Patent: *Jul. 3, 2007

(54) BONDING STRUCTURE OF DEVICE PACKAGING

(75) Inventor: Su-Tsai Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 45 days.

This patent is subject to a terminal disclaimer.

(21) Appl. No.: 11/047,646

(22) Filed: Feb. 2, 2005

(65) Prior Publication Data

US 2006/0078715 A1    Apr. 13, 2006

(30) Foreign Application Priority Data

Oct. 11, 2004   (TW) ............................... 93130750 A

(51) Int. Cl.
*H01L 23/48* (2006.01)

(52) U.S. Cl. ...................... 257/785; 257/778; 257/779; 257/784; 257/786

(58) Field of Classification Search ................ 257/776, 257/778–779, 784–786
See application file for complete search history.

(56) References Cited

U.S. PATENT DOCUMENTS

| | | | | |
|---|---|---|---|---|
| 5,065,227 A * | 11/1991 | Frankeny et al. | ........... | 257/778 |
| 5,431,328 A | 7/1995 | Chang et al. | | |
| 5,508,228 A | 4/1996 | Nolan et al. | | |
| 5,523,628 A * | 6/1996 | Williams et al. | ............ | 257/777 |
| 5,578,527 A | 11/1996 | Chang et al. | | |
| 5,681,757 A * | 10/1997 | Hayes | ........................ | 257/778 |
| 5,877,542 A * | 3/1999 | Ohuchi | ........................ | 257/667 |
| 6,005,292 A * | 12/1999 | Roldan et al. | ............... | 257/777 |
| 6,130,476 A * | 10/2000 | LaFontaine et al. | ........ | 257/678 |
| 6,194,782 B1 * | 2/2001 | Katchmar | ................... | 257/738 |
| 6,242,815 B1 * | 6/2001 | Hsu et al. | .................... | 257/786 |
| 6,376,915 B1 * | 4/2002 | Hikita et al. | ................. | 257/777 |
| 6,410,415 B1 * | 6/2002 | Estes et al. | ................. | 438/612 |
| 6,465,892 B1 | 10/2002 | Suga | | |
| 6,472,293 B1 | 10/2002 | Suga | | |
| 6,919,642 B2 * | 7/2005 | Hsieh et al. | ................ | 257/778 |
| 6,946,745 B2 * | 9/2005 | Hesse | ........................ | 257/783 |

OTHER PUBLICATIONS

Lu et al., *Low temperature Bonding of Au-Au in Non-Vacuum Environment Using Surface Activated Method*, Pan Pacific Microelectronics Symposium, Feb. 10-12, 2004, p. 87-92.

Suga et al., *Bump-less Interconnect for Next Generation System Packaging*, Electronic Components And Technology Conference, 2001, 6 pages.

* cited by examiner

*Primary Examiner*—Cathy F. Lam
(74) *Attorney, Agent, or Firm*—Rabin & Berdo, P.C.

(57) ABSTRACT

A bonding structure of device packaging includes a first substrate and a second substrate. The surfaces of the first substrate have metal pads and a first bonding layer connected to the second substrate whose surfaces have a second bonding layer and electrodes. The first bonding layer is combined with the second bonding layer, and the metal pads are in electrical communications with the electrodes. The second substrate may be a flexible substrate to decrease the strain between the first substrate and the second substrate.

18 Claims, 2 Drawing Sheets

BONDING STRUCTURE OF DEVICE PACKAGING

BACKGROUND OF THE INVENTION

1. Field of Invention

The invention relates to a bonding structure and, in particular, to a bonding structure of device packaging.

2. Related Art

With the increasing requirements of the high device reliability, high bonding density, and device size reduction in semiconductor device packaging technology, conventional wire bonding is gradually replaced by the flip-chip technology.

The flip-flop packaging technology is used to for pads or bumps at the junctions of a device and a substrate, in place of the lead frame used in the prior art, followed by coating a layer of an adhesive agent on the substrate surface. The structure is formed by directly embossing or welding the bumps of a device and the pads of a substrate together. In comparison with wire bonding, the prior art can reduce the transmission distance of electrical signals, which is suitable for the packaging of high-speed electronic devices. However, in the conventional flip-flop packaging method, the adhesive agent coated on the substrate has a serious difference in the coefficient of thermal expansion with respect to the device. When the temperature changes, the thermal stress is likely generate deformation at the bumps between the device and the substrate.

The adhesive agent used in normal flip-flop packaging can be divided into non-conductive films (NCF) and anisotropic conductive films (ACF). The conventional bonding technology coats NCF on a substrate and then bonds devices thereon by melting the NCF through pressing and heating procedures. The contraction stress produced after the film is completed cured bonds the devices together. The bonding technology can provide a higher bonding density. However, the bonding among the devices is maintained by a mechanical force. That is, the stress produced by the film maintains the conduction quality of the pads. Once the film experiences a too large stress, lamination will occur to the interfaces between the film and the circuit and substrate, increasing the resistance.

The ACF bonding technology places an ACF with conductive particles between a device and another device to be bonded. Pressing and heating procedures are employed to melt the film, bonding the devices together. A conductive channel is thus formed among metal pads, metal bumps, and conductive particles. The drawback of this technology, however, is that if the bonding pitch between adjacent metal bumps is very small, bridging phenomena will be happened. Due to the pressure and heat, conductive particles have drifting motions to result in short circuiting between adjacent two conductive points. Therefore, it cannot satisfy the requirement of miniaturization and the bonding density allows a pitch of 40 μm.

Another diffusion bonding technology makes use of high temperature to produce diffusion between the pads of devices and the substrate for bonding. However, the bonding temperature is often higher than 400 degrees of Celsius. The metal surfaces of the pads thus form metal oxide. Its covalence bond constrains free electrons of the metal, making it hard to form metal bonds at the interface. Moreover, the conduction is a result of the electron tunneling effect. There is a higher resistance at the connecting points. Therefore, it is not suitable for the applications in fine pitches.

SUMMARY OF THE INVENTION

In view of the foregoing, the invention provides a bonding structure of device packaging to achieve the goals of improving device structures and simplifying manufacturing procedures.

The disclosed bonding structure of device packaging mainly contains a first substrate and a second substrate. A surface of the first substrate has several metal pads and a first bonding metal layer. A surface of the second substrate has several electrodes and a second bonding metal layer. The first substrate is bonded with the second substrate. The first bonding metal layer and the second bonding metal layer are connected together. The metal pads and the electrodes are in electrical communications. In particular, the second substrate can be a flexible substrate, such as a polymer substrate, to buffer the stress produced by the bonding between the substrates.

Using the same principle, the invention discloses another bonding structure of device packaging. The electrodes and the second bonding metal layer are embedded into the second substrate, exposing only their top surface. Likewise, the first bonding metal layer of the first substrate is fixed on the second bonding metal layer. The metal pads are in electrical communications with the electrodes.

The connection between the first and second bonding metal layers and the electrical connection between the electrodes can be accomplished by direct thermocompression, ultrasonic bonding, or surface activated bonding. They can be done by first activating the surfaces or undergoing ultrasonic oscillations, followed by the thermocompression. Processing the bonding interface with surface activation or ultrasonic oscillations can reduce the required bonding temperature, solving the high-temperature problem in existing bonding procedures.

The disclosed bonding structure of device packaging can be applied to the bonding between integrated circuit (IC) chips and substrates, without the need of NCF or ACF. In comparison with the prior art, the invention can increase the bonding density, achieve fine-pitch bonding, increase the fabrication reliability, reduce required steps, and lower the production cost.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
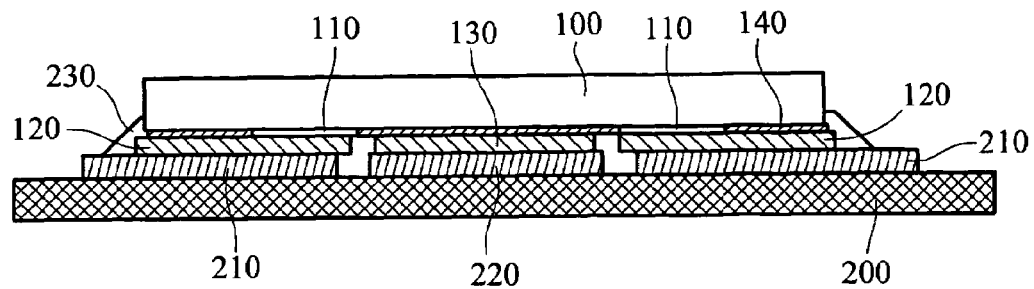
FIG. 1 is a cross-sectional view of the first embodiment of the invention.

Please refer to FIG. 1 for a detailed description of the first embodiment of the invention. As shown in the drawing, the invention contains a first substrate 100 and a second substrate 200. The first substrate 100 has several metal pads 110, adhesive metal circuit layers 120, a passivation layer 140, and a first bonding metal layer 130. In addition, the first substrate 100 has a first surface with a first center area, the several metal pads 110 are located on the first surface outside the first center area, and the first bonding metal layer 130 is located on the first center area. As can be seen in FIG. 1, the adhesive metal circuit layers 120 have a same height as that of the first bonding metal layer 130. Moreover, the adhesive metal circuit layers 120 have areas facing the second substrate and corresponding to the respective metal pads 110. The areas are larger than areas of the metal pads 110 confronting the adhesive metal circuit layers 120. The passivation layer 140 is formed on the surface of the first substrate 100, exposing the metal pads 110. The adhesive metal circuit 120 is connected to the metal pads 110 and extends to cover the passivation layer 140 for the convenience of subsequent electrical connections. The first bonding metal layer 130 covers the passivation layer 140. The second substrate 200 has several electrodes 210 and a second bonding metal layer 220. As also can be seen in FIG. 1, the electrodes 210 have a same height as that of the second bonding metal layer 220. In addition, the second substrate 200 has a second surface with a second center area, the several electrodes 210 are located on the second surface outside the second center area, and the second bonding metal layer 220 is located on the second center area. The first substrate 100 is bonded with the second substrate 200 surface to surface, so that the first bonding metal layer 130 is fixed onto the second bonding metal layer 220. The metal pads 110 are connected to the adhesive metal circuit 120 in order to electrically communicate with the electrodes 210. The bonding border of the first and second substrates 100, 200 is filled with a little adhesive 230 to stabilize the connection of the substrates 100, 200 and to prevent humidity from entering the bonding structure.

Figure 2:
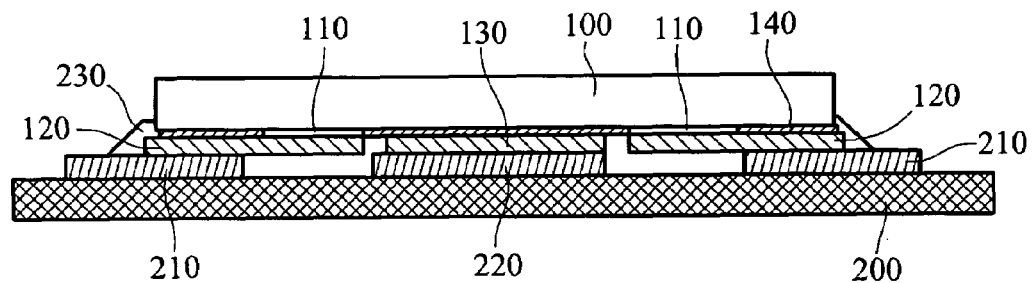
FIG. 2 is a cross-sectional view of the second embodiment of the invention.

The metal pads on the first substrate are connected to the electrodes on the second substrate using the extension of the adhesive circuit on the first substrate. With reference to FIG. 2, the second embodiment of the invention also contains a first substrate 100 and a second substrate 200. A surface of the first substrate 100 has several metal pads 110, an adhesive metal circuit 120, a passivation layer 140, and a first bonding metal layer 130. The passivation layer 140 is formed on the surface of the first substrate 110, exposing the metal pads 110. The adhesive metal circuit 120 is connected to the metal pads 110 and extends to cover the passivation layer 140. The first bonding metal layer 130 covers the passivation layer 140. A surface of the second substrate 200 has several electrodes 210 and a second bonding metal layer 220. The first substrate 100 is bonded with the second substrate 120 in such a way that the first bonding metal layer 130 is fixed onto the second bonding metal layer 220. The metal pads 110 on the first substrate 100 are not aligned with the electrodes 210 on the second substrate 200. The adhesive circuit 120 on the first substrate extends to connect to the electrodes 210 on the second substrate 200, so that the metal pads 110 are in electrical communications with the electrodes 210 via the adhesive metal circuit 120. The bonding border of the substrates 100, 200 is filled with some adhesive 230.

Figure 3:
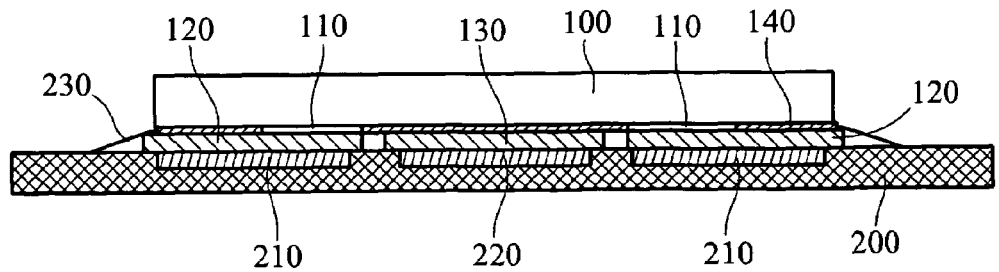
FIG. 3 is a cross-sectional view of the third embodiment of the invention.

Moreover, the invention can embed the electrodes 210 and the second bonding metal layer 220 into the second substrate 200, exposing only their top surfaces. A cross-sectional view of the third embodiment is shown in FIG. 3. It includes a first substrate 100 and a second substrate 200. The structure of the first substrate 100 is as described before. The electrodes 210 and the second bonding metal layer 220 installed on the surface of the second substrate 200 are embedded into the second substrate 200, exposing only their top surfaces. The first substrate 100 is bonded with the second substrate 200 surface to surface, so that the first bonding metal layer 130 is fixed onto the second bonding metal layer 220. The bonding border of the first and second substrates 100, 200 is filled with some adhesive agent 230. Using the embedded second substrate structure, the packaging volume can be further reduced.

In particular, the embedded substrate can be prepared using the following steps, with reference to FIGS. 4A to 4D.

Figure 4A:
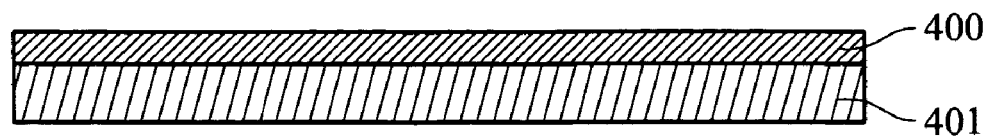
FIGS. 4A to 4D are schematic views of the fabrication procedure for an embedded substrate.

As shown in FIG. 4A, a metal layer 400 is deposited on the substrate 401.

Figure 4B:
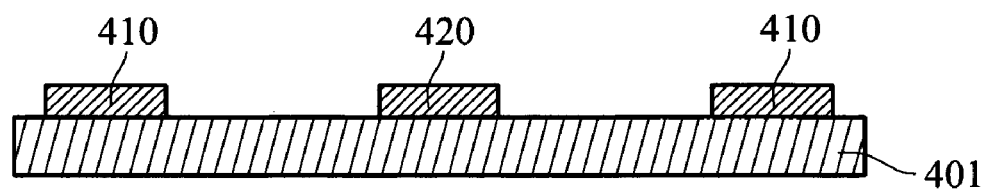

As shown in FIG. 4B, the metal layer 400 is etched to form the required electrodes 410 and the second metal bonding layer 420.

Figure 4C:
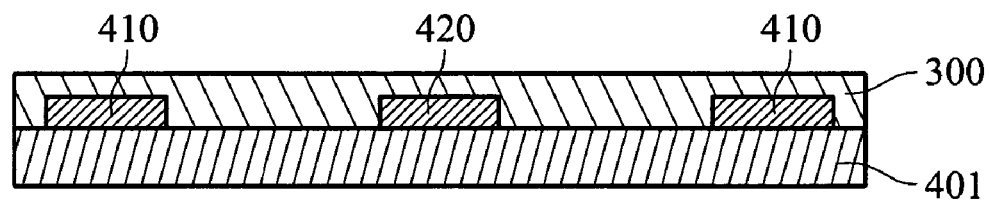

As shown in FIG. 4C, a polymer layer 300 is coated on the substrate to cover the electrodes 410 and the second metal bonding layer 420.

Figure 4D:
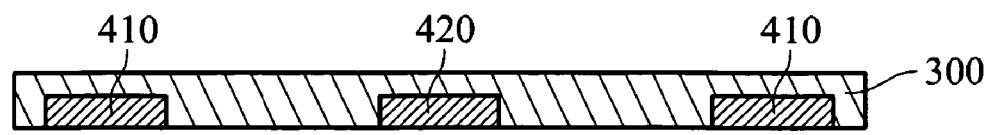

As shown in FIG. 4D, the substrate 410 is removed, exposing the surfaces of the electrodes 410 and the second metal bonding layer 420 embedded into the polymer layer 300, thereby forming the embedded second substrate.

The bonding between the first bonding metal layer and the second bonding metal layer and the electrical connections between the electrodes and the adhesive metal circuit or the metal pads are accomplished by direct thermocompression, ultrasonic bonding, or surface activation. One may also first process the bonding metal layers by surface activation or ultrasonic oscillations, followed by thermocompression or direct bonding. The surface activation removes the dust particles and oxide layer on the surfaces of the first metal layer, the bonding layer and the electrodes, followed by subsequent bonding procedures to form metal bonds at the junction interface. Therefore, the bonding structure of the device packaging thus formed between the first and second substrates has very good electrical properties.

The invention uses the connection between a first metal bonding layer and a second metal bonding layer to bond the first and second substrates, without the use of NCF or ACF. Since the first metal bonding layer can be formed simultaneously with the metal pads or adhesive metal circuit of the first substrate, and the second metal bonding layer can be formed simultaneously with the electrodes on the second substrate, the fabrication steps and cost can be largely reduced. The surface activation or ultrasonic processing on the junction interfaces can reduce the bonding temperature, solving the high-temperature problem in the existing bonding processes.

Certain variations would be apparent to those skilled in the art, which variations are considered within the spirit and scope of the claimed invention.

What is claimed is:

1. A bonding structure of device packaging, comprising:
    a first substrate having a first surface with a first center area, a plurality of metal pads located on the first surface outside the first center area, and a first bonding metal layer located on the first center area; and
    a second substrate, having a second surface with a second center area, a plurality of electrodes located on the second surface outside the second center area, and a second bonding metal layer located on the second center area;
        wherein the second bonding metal layer is adhered onto the first bonding metal layer so that the first substrate and the second substrate are bonded together, and the metal pads are in electrical communication with the electrodes; and wherein the first substrate contains adhesive metal circuit layers, the adhesive metal circuit layers having areas facing the second substrate and corresponding to the respective metal pads and being larger than areas of the metal pads, wherein the adhesive metal circuit layers connect the metal pads and the electrodes.

2. The bonding structure of device packaging of claim 1, wherein the electrodes and the adhesive metal circuit layers are connected by a means selected from a group consisting of thermocompression, ultrasonic bonding, and surface activated bonding.

3. The bonding structure of device packaging of claim 1, wherein the electrodes and the adhesive metal circuit layers are connected by processing junction surfaces of the first bonding metal layer and the second bonding metal layer using a means selected from the group consisting of ultrasonic oscillation and surface activation, followed by a means selected from the group consisting of thermocompression and direct bonding.

4. The bonding structure of device packaging of claim 1, wherein the first substrate contains a passivation layer covering the first substrate and exposing the metal pads.

5. The bonding structure of device packaging of claim 4, wherein the first substrate contains an adhesive metal circuit connecting the metal pads and the electrodes and extending to cover the passivation layer.

6. The bonding structure of device packaging of claim 5, wherein the adhesive circuit of the first substrate extends to connect to the electrodes of the second substrate.

7. The bonding structure of device packaging of claim 1, wherein the second substrate is a flexible substrate.

8. The bonding structure of device packaging of claim 7, wherein the flexible substrate is a polymer substrate.

9. The bonding structure of device packaging of claim 1, wherein the second substrate is an embedded substrate, the electrodes and the second bonding metal layer being embedded into the second substrate, exposing only their top surfaces.

10. The bonding structure of device packaging of claim 1, wherein the embedded substrate is prepared following the steps of:
    depositing a metal layer on a supporting substrate;
    etching the metal layer to form the electrodes and the second metal bonding layer;
    coating a polymer layer on the supporting substrate to cover the electrodes and the second metal bonding layer; and
    removing the supporting substrate to expose the top surfaces of the electrodes and the second metal bonding layer embedded in the polymer layer, thereby forming the embedded substrate.

11. The bonding structure of device packaging of claim 1, wherein the connection between the first bonding metal layer and the second bonding metal layer is accomplished using a means selected from the group consisting of thermocompression, ultrasonic bonding, and surface activated bonding.

12. The bonding structure of device packaging of claim 1, wherein the connection between the first bonding metal layer and the second bonding metal layer is achieved by processing junction surfaces of the first bonding metal layer and the second bonding metal layer using a means selected from the group consisting of ultrasonic oscillation and surface activation, followed by a means selected from the group consisting of thermocompression and direct bonding.

13. The bonding structure of device packaging of claim 1, further comprising an adhesive agent used to bond borders of the first and second substrates.

14. The bonding structure of device packaging of claim 1, wherein the adhesive metal circuit layers have a same height as that of the first bonding metal layer, and the electrodes have a same height as that of the second bonding metal layer.

15. A bonding structure of device packaging, comprising:
    a first substrate having a first surface;
    a plurality of metal pads on the first surface;
    a first bonding metal layer on the first surface, spaced from the metal pads;
    a second substrate having a second surface facing the first surface;
    a plurality of electrodes on the second surface; and
    a second bonding metal layer on the second surface, spaced from the electrodes and facing the first bonding metal layer,
        wherein the second bonding metal layer is adhered onto the first bonding metal layer so that the first substrate and the second substrate are bonded together, and the metal pads are in electrical communications with the electrodes,
        wherein the second substrate is an embedded substrate, the electrodes and the second bonding metal layer being embedded into the second substrate, exposing only their top surfaces, and
        wherein the first bonding metal layer and the second bonding metal layer are located on the center areas of the respective substrates.

16. The bonding structure of device packaging of claim 15, wherein the second substrate is a flexible substrate.

17. A bonding structure of device packaging, comprising:
    a first substrate having a first surface;
    a plurality of metal pads on the first surface;
    a first bonding metal layer on the first surface, spaced from the metal pads;
    a second substrate having a second surface facing the first surface;
    a plurality of electrodes on the second surface; and
    a second bonding metal layer on the second surface, spaced from the electrodes and facing the first bonding metal layer,
    wherein the second bonding metal layer is adhered onto the first bonding metal layer so that the first substrate and the second substrate are bonded together, and the metal pads are in electrical communication with the electrodes, wherein the first bonding metal layer and the second bonding metal layer are located on the center areas of the respective substrates
        further comprising an adhesive agent bonding borders of the first and second substrates.

18. The bonding structure of device packaging of claim 17, wherein the second substrate is a flexible substrate.

* * * * *